(12) United States Patent
Lehman, Jr.

(10) Patent No.: US 9,119,309 B1
(45) Date of Patent: *Aug. 25, 2015

(54) IN SITU OXIDE REMOVAL, DISPERSAL AND DRYING

(75) Inventor: Stephen Edward Lehman, Jr., Spartanburg, SC (US)

(73) Assignee: SDCmaterials, Inc., Tempe, AZ (US)

( * ) Notice: Subject to any disclaimer, the term of this patent is extended or adjusted under 35 U.S.C. 154(b) by 46 days.

This patent is subject to a terminal disclaimer.

(21) Appl. No.: 12/961,200

(22) Filed: Dec. 6, 2010

Related U.S. Application Data

(60) Provisional application No. 61/284,329, filed on Dec. 15, 2009.

(51) Int. Cl.
| | | |
|---|---|---|
| *B44C 1/22* | (2006.01) | |
| *H05K 1/03* | (2006.01) | |
| *H01B 1/02* | (2006.01) | |
| *B22F 1/00* | (2006.01) | |

(52) U.S. Cl.
CPC ............... *H05K 1/0306* (2013.01); *H01B 1/02* (2013.01); *B22F 2001/0092* (2013.01)

(58) Field of Classification Search
CPC  B22F 2001/0092; H01B 1/02; H05K 1/0306; H01L 21/4846
USPC .................................................. 216/37, 100
See application file for complete search history.

(56) References Cited

U.S. PATENT DOCUMENTS

| | | | |
|---|---|---|---|
| 2,284,554 A | 5/1942 | Beyerstedy | 196/10 |
| 2,419,042 A | 4/1947 | Todd | 202/205 |
| 2,519,531 A | 8/1950 | Worn | 230/95 |
| 2,562,753 A | 7/1951 | Trost | 241/39 |
| 2,689,780 A | 9/1954 | Rice | 23/106 |
| 3,001,402 A | 9/1961 | Koblin | 73/421.5 |
| 3,067,025 A | 12/1962 | Chisholm | 75/84.5 |
| 3,145,287 A | 8/1964 | Siebein et al. | |
| 3,178,121 A | 4/1965 | Wallace, Jr. | 241/5 |
| 3,179,782 A | 4/1965 | Matvay | |
| 3,313,908 A | 4/1967 | Unger et al. | |
| 3,401,465 A | 9/1968 | Larwill | 34/57 |
| 3,450,926 A | 6/1969 | Kieman | 313/231 |
| 3,457,788 A | 7/1969 | Nobuo Miyajima | 73/422 |
| 3,537,513 A | 11/1970 | Austin | 165/70 |
| 3,741,001 A | 6/1973 | Fletcher et al. | 73/28 |
| 3,752,172 A | 8/1973 | Cohen et al. | |
| 3,774,442 A | 11/1973 | Gustavsson | 73/28 |
| 3,830,756 A | 8/1974 | Sanchez et al. | |
| 3,892,882 A | 7/1975 | Guest et al. | |
| 3,914,573 A | 10/1975 | Muehlberger | |
| 3,959,420 A | 5/1976 | Geddes et al. | 261/112 |
| 4,008,620 A | 2/1977 | Narato et al. | 73/421.5 A |
| 4,018,388 A | 4/1977 | Andrews | 241/39 |
| 4,139,497 A | 2/1979 | Castor et al. | 252/470 |
| 4,157,316 A | 6/1979 | Thompson et al. | |
| 4,171,288 A | 10/1979 | Keith et al. | 252/462 |
| 4,174,298 A | 11/1979 | Antos | |
| 4,248,387 A | 2/1981 | Andrews | 241/5 |
| 4,284,609 A | 8/1981 | deVries | 423/242 |
| 4,388,274 A | 6/1983 | Rourke et al. | 422/177 |
| 4,431,750 A | 2/1984 | McGinnis et al. | |
| 4,436,075 A | 3/1984 | Campbell et al. | 123/557 |
| 4,505,945 A | 3/1985 | Dubust et al. | |
| 4,513,149 A | 4/1985 | Gray et al. | 564/449 |
| 4,731,517 A | 3/1988 | Cheney | |
| 4,764,283 A | 8/1988 | Ashbrook et al. | 210/695 |
| 4,824,624 A | 4/1989 | Palicka et al. | 264/67 |
| 4,855,505 A | 8/1989 | Koll | 564/398 |
| 4,866,240 A | 9/1989 | Webber | |
| 4,885,038 A * | 12/1989 | Anderson et al. | 156/89.18 |
| 4,983,555 A | 1/1991 | Roy et al. | 501/120 |
| 4,987,033 A | 1/1991 | Abkowitz et al. | 428/469 |
| 5,041,713 A | 8/1991 | Weidman | |
| 5,043,548 A | 8/1991 | Whitney et al. | 219/121.84 |
| 5,070,064 A | 12/1991 | Hsu et al. | |

(Continued)

FOREIGN PATENT DOCUMENTS

| | | | | |
|---|---|---|---|---|
| JP | 56-146804 | | 11/1981 | ............... B22F 9/08 |
| JP | 7031873 A | | 2/1995 | ............... B01J 19/08 |

(Continued)

OTHER PUBLICATIONS

Fojtik et al. (Surface Chemistry of Luminescent Colloidal Silicon Nanaparticles, J. Phys. Chem. B, 110, (2006) pp. 1994-1998).*

Fojtik (Fojtik et al. Chemical Physics Letters 221 (1994) pp. 363-367) used only as evidence.*

A. Gutsch et al., "Gas-Phase Production of Nanoparticles", Kona No. 20, 2002, pp. 24-37.

Dr. Heike Mühlenweg et al., "Gas-Phase Reactions—Open Up New Roads to Nanoproducts", Degussa ScienceNewsletter No. 08, 2004, pp. 12-16.

(Continued)

*Primary Examiner* — Duy Deo
*Assistant Examiner* — Mahmoud Dahimene
(74) *Attorney, Agent, or Firm* — Morrison & Foerster LLP

(57) ABSTRACT

A method of removing oxide from metallic powder. The method comprises: providing a powder defined by a plurality of particles, each particle in the plurality of particles having a metallic core and an oxide layer surrounding the metallic core; etching the plurality of particles, wherein the oxide layer is removed from each particle in the plurality of particles, leaving only the metallic core; coating each particle in the etched plurality of particles with an organic layer; dispersing the etched plurality of particles; and providing the powder as dispersed particles that are absent an oxide layer surrounding the metallic core, each metallic core being coated with an organic layer. The steps of etching, coating and dispersing are performed in situ with the plurality of particles disposed in liquid, absent any exposure of the metallic cores to air.

13 Claims, 14 Drawing Sheets

(56) References Cited

U.S. PATENT DOCUMENTS

| | | | |
|---|---|---|---|
| 5,073,193 A | 12/1991 | Chaklader et al. ............... 75/346 |
| 5,157,007 A | 10/1992 | Domesle et al. |
| 5,369,241 A | 11/1994 | Taylor et al. ............ 219/121.47 |
| 5,371,049 A | 12/1994 | Moffett et al. ................. 501/89 |
| 5,372,629 A | 12/1994 | Anderson et al. ............... 75/332 |
| 5,392,797 A | 2/1995 | Welch .......................... 134/108 |
| 5,439,865 A | 8/1995 | Abe et al. ...................... 502/333 |
| 5,442,153 A | 8/1995 | Marantz et al. |
| 5,460,701 A | 10/1995 | Parker et al. |
| 5,485,941 A | 1/1996 | Guyomard et al. ................ 222/1 |
| 5,534,149 A | 7/1996 | Birkenbeil et al. ........... 210/636 |
| 5,553,507 A | 9/1996 | Basch et al. ............... 73/863.01 |
| 5,611,896 A | 3/1997 | Swanepoel et al. ........... 204/169 |
| 5,630,322 A | 5/1997 | Heilmann et al. ................ 62/95 |
| 5,726,414 A | 3/1998 | Kitahashi et al. |
| 5,749,938 A | 5/1998 | Coombs ........................ 75/332 |
| 5,776,359 A | 7/1998 | Schultz et al. ............. 252/62.51 |
| 5,788,738 A | 8/1998 | Pirzada et al. ................... 75/331 |
| 5,811,187 A | 9/1998 | Anderson et al. ............ 428/403 |
| 5,837,959 A | 11/1998 | Muehlberger et al. |
| 5,851,507 A | 12/1998 | Pirzada et al. ................. 423/659 |
| 5,853,815 A | 12/1998 | Muehlberger ................ 427/446 |
| 5,905,000 A | 5/1999 | Yadav et al. ..................... 429/33 |
| 5,935,293 A | 8/1999 | Detering et al. ............. 75/10.29 |
| 5,989,648 A | 11/1999 | Phillips ........................ 427/456 |
| 5,993,967 A | 11/1999 | Brotzman, Jr. et al. ....... 428/407 |
| 5,993,988 A | 11/1999 | Ohara et al. .................... 429/40 |
| 6,012,647 A | 1/2000 | Ruta et al. ................... 239/132.1 |
| 6,033,781 A | 3/2000 | Brotzman, Jr. et al. ....... 428/405 |
| 6,059,853 A | 5/2000 | Coombs ........................ 75/332 |
| 6,102,106 A | 8/2000 | Manning et al. ................ 165/76 |
| 6,213,049 B1 | 4/2001 | Yang |
| 6,214,195 B1 | 4/2001 | Yadav et al. ................... 205/334 |
| 6,228,904 B1 | 5/2001 | Yadav et al. ................... 523/210 |
| 6,254,940 B1 | 7/2001 | Pratsinis et al. ............... 427/562 |
| 6,261,484 B1 | 7/2001 | Phillips et al. ..................... 264/5 |
| 6,267,864 B1 | 7/2001 | Yadav et al. ................... 205/341 |
| 6,342,465 B1 | 1/2002 | Klein et al. |
| 6,344,271 B1 | 2/2002 | Yadav et al. ................... 428/402 |
| 6,379,419 B1 | 4/2002 | Celik et al. ....................... 75/346 |
| 6,387,560 B1 | 5/2002 | Yadav et al. ..................... 429/45 |
| 6,395,214 B1 | 5/2002 | Kear et al. ..................... 264/434 |
| 6,398,843 B1 | 6/2002 | Tarrant ............................ 75/249 |
| 6,409,851 B1 | 6/2002 | Sethuram et al. ............. 148/565 |
| 6,413,781 B1 | 7/2002 | Geis et al. ..................... 436/178 |
| 6,416,818 B1 | 7/2002 | Aikens et al. ............... 427/383.1 |
| RE37,853 E | 9/2002 | Detering et al. ............. 75/10.19 |
| 6,444,009 B1 | 9/2002 | Liu et al. .......................... 75/332 |
| 6,517,800 B1 | 2/2003 | Cheng et al. ................ 423/447.1 |
| 6,524,662 B2 | 2/2003 | Jang et al. ..................... 427/535 |
| 6,531,704 B2 | 3/2003 | Yadav et al. ................. 250/493.1 |
| 6,548,445 B1 | 4/2003 | Buysch et al. |
| 6,554,609 B2 | 4/2003 | Yadav et al. ...................... 432/9 |
| 6,562,495 B2 | 5/2003 | Yadav et al. ..................... 429/12 |
| 6,569,397 B1 | 5/2003 | Yadav et al. ................... 423/345 |
| 6,569,518 B2 | 5/2003 | Yadav et al. ................... 428/323 |
| 6,572,672 B2 | 6/2003 | Yadav et al. ..................... 75/343 |
| 6,596,187 B2 | 7/2003 | Coll et al. ........................ 216/56 |
| 6,603,038 B1 | 8/2003 | Hagemeyer et al. ........ 560/241.1 |
| 6,607,821 B2 | 8/2003 | Yadav et al. ................... 428/323 |
| 6,610,355 B2 | 8/2003 | Yadav et al. ................... 427/115 |
| 6,623,559 B2 | 9/2003 | Huang |
| 6,635,357 B2 | 10/2003 | Moxson et al. ............... 428/548 |
| 6,641,775 B2 | 11/2003 | Vigliotti et al. ............... 264/618 |
| 6,652,822 B2 | 11/2003 | Phillips et al. ................ 423/290 |
| 6,652,967 B2 | 11/2003 | Yadav et al. ................... 428/403 |
| 6,669,823 B1 | 12/2003 | Sarkas et al. .................. 204/164 |
| 6,682,002 B2 | 1/2004 | Kyotani ......................... 239/318 |
| 6,689,192 B1 | 2/2004 | Phillips et al. .................. 75/342 |
| 6,699,398 B1 | 3/2004 | Kim ................................ 216/55 |
| 6,706,097 B2 | 3/2004 | Zornes ............................ 96/153 |
| 6,710,207 B2 | 3/2004 | Bogan, Jr. et al. |
| 6,713,176 B2 | 3/2004 | Yadav et al. ................... 428/402 |
| 6,716,525 B1 | 4/2004 | Yadav et al. ................... 428/402 |
| 6,746,791 B2 | 6/2004 | Yadav et al. ..................... 429/30 |
| 6,772,584 B2 | 8/2004 | Chun et al. ...................... 60/275 |
| 6,786,950 B2 | 9/2004 | Yadav et al. .................... 75/346 |
| 6,813,931 B2 | 11/2004 | Yadav et al. ................. 73/31.05 |
| 6,817,388 B2 | 11/2004 | Tsangaris et al. ............... 141/82 |
| 6,832,735 B2 | 12/2004 | Yadav et al. ..................... 241/16 |
| 6,838,072 B1 | 1/2005 | Kong et al. ................. 423/594.2 |
| 6,855,426 B2 | 2/2005 | Yadav .......................... 428/403 |
| 6,855,749 B1 | 2/2005 | Yadav et al. ................... 523/105 |
| 6,886,545 B1 | 5/2005 | Holm ....................... 123/568.21 |
| 6,896,958 B1 | 5/2005 | Cayton et al. ................. 428/323 |
| 6,902,699 B2 | 6/2005 | Fritzemeier et al. ........... 419/38 |
| 6,916,872 B2 | 7/2005 | Yadav et al. ................... 524/430 |
| 6,919,527 B2 | 7/2005 | Boulos et al. ............. 219/121.52 |
| 6,933,331 B2 | 8/2005 | Yadav et al. ................... 523/210 |
| 6,986,877 B2 | 1/2006 | Takikawa et al. .......... 423/447.3 |
| 6,994,837 B2 | 2/2006 | Boulos et al. .................. 423/613 |
| 7,007,872 B2 | 3/2006 | Yadav et al. ..................... 241/1 |
| 7,022,305 B2 | 4/2006 | Drumm et al. |
| 7,052,777 B2 | 5/2006 | Brotzman, Jr. et al. ....... 428/570 |
| 7,073,559 B2 | 7/2006 | O'Larey et al. .............. 164/76.1 |
| 7,081,267 B2 | 7/2006 | Yadav .......................... 427/115 |
| 7,101,819 B2 | 9/2006 | Rosenflanz et al. ............. 501/10 |
| 7,147,544 B2 | 12/2006 | Rosenflanz ..................... 451/28 |
| 7,147,894 B2 | 12/2006 | Zhou et al. .................... 427/256 |
| 7,166,198 B2 | 1/2007 | Van Der Walt et al. ....... 204/165 |
| 7,166,663 B2 | 1/2007 | Cayton et al. ................. 524/430 |
| 7,172,649 B2 | 2/2007 | Conrad et al. .................. 106/35 |
| 7,172,790 B2 | 2/2007 | Koulik et al. ................. 427/212 |
| 7,178,747 B2 | 2/2007 | Yadav et al. ..................... 241/23 |
| 7,208,126 B2 | 4/2007 | Musick et al. .................. 423/69 |
| 7,211,236 B2 | 5/2007 | Stark et al. .................. 423/592.1 |
| 7,217,407 B2 | 5/2007 | Zhang .......................... 423/610 |
| 7,220,398 B2 | 5/2007 | Sutorik et al. ............. 423/593.1 |
| 7,307,195 B2 | 12/2007 | Polverejan et al. ............ 585/443 |
| 7,323,655 B2 | 1/2008 | Kim .......................... 219/121.43 |
| 7,384,447 B2 | 6/2008 | Kodas et al. .................... 75/332 |
| 7,417,008 B2 | 8/2008 | Richards et al. |
| 7,494,527 B2 | 2/2009 | Jurewicz et al. ................ 75/346 |
| 7,541,012 B2 | 6/2009 | Yeung et al. |
| 7,572,315 B2 | 8/2009 | Boulos et al. ................... 75/336 |
| 7,611,686 B2 | 11/2009 | Alekseeva et al. ............ 423/276 |
| 7,615,097 B2 | 11/2009 | McKechnie et al. ........... 75/346 |
| 7,622,693 B2 | 11/2009 | Foret ....................... 219/121.43 |
| 7,803,210 B2 | 9/2010 | Sekine et al. .................... 75/334 |
| 7,955,583 B2 | 6/2011 | Tsuzukihashi et al. |
| 2001/0042802 A1 | 11/2001 | Youds ................................ 241/5 |
| 2002/0018815 A1 | 2/2002 | Sievers et al. ................. 424/489 |
| 2002/0068026 A1 | 6/2002 | Murrell et al. ................. 422/211 |
| 2002/0079620 A1 | 6/2002 | DuBuis et al. ........... 264/328.14 |
| 2002/0102674 A1 | 8/2002 | Anderson ..................... 435/174 |
| 2002/0143417 A1 | 10/2002 | Ito et al. |
| 2002/0182735 A1 | 12/2002 | Kibby et al. |
| 2003/0036786 A1 | 2/2003 | Duren et al. .................... 607/96 |
| 2003/0042232 A1 | 3/2003 | Shimazu |
| 2003/0066800 A1 | 4/2003 | Saim et al. ........................ 264/5 |
| 2003/0108459 A1 | 6/2003 | Wu et al. .................. 422/186.04 |
| 2003/0139288 A1 | 7/2003 | Cai et al. |
| 2003/0172772 A1 | 9/2003 | Sethuram et al. .............. 501/87 |
| 2003/0223546 A1 | 12/2003 | McGregor et al. ............ 378/143 |
| 2004/0009118 A1 | 1/2004 | Phillips et al. .............. 423/592.1 |
| 2004/0023302 A1 | 2/2004 | Archibald et al. ............. 435/7.1 |
| 2004/0023453 A1 | 2/2004 | Xu et al. ........................ 257/369 |
| 2004/0077494 A1 | 4/2004 | LaBarge et al. ............... 502/303 |
| 2004/0103751 A1 | 6/2004 | Joseph et al. ................. 75/10.19 |
| 2004/0119064 A1 | 6/2004 | Narayan et al. |
| 2004/0127586 A1 | 7/2004 | Jin et al. |
| 2004/0167009 A1 | 8/2004 | Kuntz et al. .................. 501/95.2 |
| 2004/0176246 A1 | 9/2004 | Shirk et al. .................... 502/439 |
| 2004/0213998 A1 | 10/2004 | Hearley et al. ................ 428/402 |
| 2004/0251017 A1 | 12/2004 | Pillion et al. .................. 165/289 |
| 2005/0000321 A1 | 1/2005 | O'Larey et al. ................ 75/952 |
| 2005/0000950 A1 | 1/2005 | Schroder et al. ......... 219/121.59 |
| 2005/0077034 A1 | 4/2005 | King ............................. 165/163 |
| 2005/0097988 A1 | 5/2005 | Kodas et al. .................... 75/332 |
| 2005/0199739 A1 | 9/2005 | Kuroda et al. |
| 2005/0220695 A1 | 10/2005 | Abatzoglou et al. .......... 423/445 |
| 2005/0233380 A1 | 10/2005 | Persiri et al. ................... 435/7.1 |
| 2005/0240069 A1 | 10/2005 | Polverejan et al. ............ 585/444 |
| 2005/0258766 A1 | 11/2005 | Kim ......................... 315/111.21 |

(56) References Cited

U.S. PATENT DOCUMENTS

| | | | |
|---|---|---|---|
| 2006/0051505 A1 | 3/2006 | Kortshagen et al. | 427/212 |
| 2006/0068989 A1 | 3/2006 | Ninomiya et al. | 502/339 |
| 2006/0094595 A1 | 5/2006 | Labarge | |
| 2006/0105910 A1 | 5/2006 | Zhou et al. | 502/338 |
| 2006/0108332 A1 | 5/2006 | Belashchenko | 219/121.47 |
| 2006/0153728 A1 | 7/2006 | Schoenung et al. | 419/32 |
| 2006/0153765 A1 | 7/2006 | Pham-Huu et al. | 423/345 |
| 2006/0159596 A1 | 7/2006 | De La Veaux et al. | 422/151 |
| 2006/0231525 A1 | 10/2006 | Asakawa et al. | 216/56 |
| 2007/0048206 A1 | 3/2007 | Hung et al. | |
| 2007/0063364 A1 | 3/2007 | Hsiao et al. | 264/5 |
| 2007/0084308 A1 | 4/2007 | Nakamura et al. | 75/346 |
| 2007/0084834 A1 | 4/2007 | Hanus et al. | 219/121.5 |
| 2007/0087934 A1 | 4/2007 | Martens et al. | 502/214 |
| 2007/0173403 A1 | 7/2007 | Koike et al. | 502/300 |
| 2007/0253874 A1 | 11/2007 | Foret | 422/186.07 |
| 2007/0292321 A1 | 12/2007 | Plischke et al. | 422/198 |
| 2008/0031806 A1 | 2/2008 | Gavenonis et al. | |
| 2008/0038578 A1 | 2/2008 | Li | |
| 2008/0064769 A1 | 3/2008 | Sato et al. | |
| 2008/0105083 A1 | 5/2008 | Nakamura et al. | 75/255 |
| 2008/0116178 A1 | 5/2008 | Weidman | |
| 2008/0138651 A1 | 6/2008 | Doi et al. | |
| 2008/0206562 A1 | 8/2008 | Stucky et al. | |
| 2008/0207858 A1 | 8/2008 | Kowaleski et al. | 526/176 |
| 2008/0274344 A1 | 11/2008 | Vieth et al. | |
| 2009/0010801 A1 | 1/2009 | Murphy et al. | |
| 2009/0088585 A1 | 4/2009 | Schammel et al. | |
| 2009/0114568 A1 | 5/2009 | Trevino et al. | |
| 2009/0162991 A1 | 6/2009 | Beneyton et al. | |
| 2009/0168506 A1 | 7/2009 | Han et al. | |
| 2009/0170242 A1 | 7/2009 | Lin et al. | |
| 2009/0181474 A1 | 7/2009 | Nagai | |
| 2009/0274903 A1 | 11/2009 | Addiego | |
| 2009/0286899 A1 | 11/2009 | Hofmann et al. | |
| 2012/0045383 A1 | 2/2012 | Matheson et al. | |

FOREIGN PATENT DOCUMENTS

| | | | | |
|---|---|---|---|---|
| SU | 493241 | | 3/1976 | |
| TW | 201023207 | * | 6/2010 | H01B 1/01 |
| WO | WO 02/092503 A1 | | 11/2002 | C01B 21/064 |
| WO | WO 2004/052778 A2 | | 6/2004 | C01B 13/28 |
| WO | WO 2006/079213 A1 | | 8/2006 | B01J 2/04 |

OTHER PUBLICATIONS

Coating Generation: Vaporization of Particles in Plasma Spraying and Splat Formation, M. Vardelle, A. Vardelle,K-I li P. Fauchais, Universite de Limoges, 123 Avenue A. Thomas 87000, Limoges, F. , Pure & Chem, vol. 68, No. 5, pp. 1093-1099, 1996.
H. Konrad et al., "Nanostructured Cu-Bi Alloys Prepared by Co-Evaporation in a Continuous Gas Flow," NanoStructured Materials, vol. 7, No. 6, 1996, pp. 605-610.
Kenvin et al. "Supported Catalysts Prepared from Mononuclear Copper Complexes: Catalytic Properties", Journal of Catalysis, pp. 81-91, (1992).
J. Heberlein, "New Approaches in Thermal Plasma Technology", Pure Appl. Chem., vol. 74, No. 3, 2002, pp. 327-335.
M.Vardelle et al., "Experimental Investigation of Powder Vaporization in Thermal Plasma Jets," Plasma Chemistry and Plasma Processing, vol. 11, No. 2, Jun. 1991, pp. 185-201.
National Aeronautics and Space Administration, "Enthalpy", http://www.grc.nasa.gov/WWW/K-12/airplane/enthalpy.html, Nov. 23, 2009, 1 page.
P. Fauchais et al., "Plasma Spray: Study of the Coating Generation," Ceramics International, Elsevier, Amsterdam, NL, vol. 22, No. 4, Jan. 1996, pp. 295-303.
P. Fauchais et al., "Les Dépôts Par Plasma Thermique," Revue Generale De L'Electricitie, RGE. Paris, FR, No. 2, Jan. 1993, pp. 7-12.
P. Fauchais et al, "La Projection Par Plasma: Une Revue," Annales De Physique, vol. 14, No. 3, Jun. 1989, pp. 261-310.
T. Yoshida, "The Future of Thermal Plasma Processing for Coating", Pure & Appl. Chem., vol. 66, No. 6, 1994 pp. 1223-1230.
Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.
Nagai, Yasutaka, et al., "Sintering Inhibition Mechanism of Plantinum Supported on Ceria-based Oxide and Pt-oxide-support Interaction,"Journal of Catalysis 242 (2006), pp. 103-109, Jul. 3, 2006, Elsevier.
Bateman, James E. et al., "Alkylation of Porous Silicon by Direct Reaction with Alkenes and Alkynes," Angew. Chem Int. Ed., Dec. 17, 1998, 37, No. 19, pp. 2683-2685.
Langner, Alexander et al., "Controlled Silicon Surface Functionalization by Alkene Hydrosilylation," J. Am. Chem. Soc., Aug. 25, 2005, 127, pp. 12798-12799.
Liu, Shu-Man et al., "Enhanced Photoluminescence from Si Nano-organosols by Functionalization with Alkenes and Their Size Evolution," Chem. Mater., Jan. 13, 2006, 18,pp. 637-642.
Fojtik, Anton, "Surface Chemistry of Luminescent Colloidal Silicon Nanoparticles," J. Phys. Chem. B., Jan. 13, 2006, pp. 1994-1998.
Li, Dejin et al., "Environmentally Responsive "Hairy" Nanoparticles: Mixed Homopolymer Brushes on Silica Nanoparticles Synthesized by Living Radical Polymerization Techniques,"J.Am. Chem. Soc., Apr. 9, 2005, 127,pp. 6248-6256.
Neiner, Doinita, "Low-Temperature Solution Route to Macroscopic Amounts of Hydrogen Terminated Silicon Nanoparticles," J. Am. Chem. Soc., Aug. 5, 2006, 128, pp. 11016-11017.
Fojtik, Anton et al., "Luminescent Colloidal Silicon Particles,"Chemical Physics Letters 221, Apr. 29, 1994, pp. 363-367.
Netzer, Lucy et al., "A New Approach to Construction of Artificial Monolayer Assemblies," J. Am. Chem. Soc., 1983, 105, pp. 674-676.
Chen, H.-S. et al., "On the Photoluminescence of Si Nanoparticles," Mater. Phys. Mech. 4, Jul. 3, 2001, pp. 62-66.
Kwon, Young-Soon et al. "Passivation Process for Superfine Aluminum Powders Obtained by Electrical Explosion of Wires," Applied Surface Science 211, Apr. 30, 2003, pp. 57-67.
Liao, Ying-Chih et al., "Self-Assembly of Organic Monolayers on Aerosolized Silicon Nanoparticles," J.Am. Chem. Soc., Jun. 27, 2006, 128, pp. 9061-9065.
Zou, Jing et al., "Solution Synthesis of Ultrastable Luminescent Siloxane-Coated Silicon Nanoparticles," Nano Letters, Jun. 4, 2004, vol. 4, No. 7, pp. 1181-1186.
Tao, Yu-Tai, "Structural Comparison of Self-Assembled Monolayers of n-Alkanoic Acids on the surfaces of Silver, Copper, and Aluminum," J. Am. Chem. Soc., May 1993, 115, pp. 4350-4358.
Sailor, Michael et al., "Surface Chemistry of Luminescent Silicon Nanocrystallites," Adv. Mater, 1997, 9, No. 10, pp. 783-793.
Li, Xuegeng et al., "Surface Functionalization of Silicon Nanoparticles Produced by Laser-Driven Pyrolysis of Silane Followed by HF-HNO3 Etching," Langmuir, May 25, 2004, pp. 4720-4727.
Carrot, Geraldine et al., "Surface-Initiated Ring-Opening Polymerization: A Versatile Method for Nanoparticle Ordering," Macromolecules, Sep. 17, 2002, 35, pp. 8400-8404.
Jouet, R. Jason et al., "Surface Passivation of Bare Aluminum Nanoparticles Using Perfluoroalkyl Carboxylic Acids," Chem. Mater., Jan. 25, 2005, 17, pp. 2987-2996.
Yoshida, Toyonobu, "The Future of Thermal Plasma Processing for Coating," Pure & Appl. Chem., vol. 66, No. 6, 1994, pp. 1223-1230.
Kim, Namyong Y. et al., "Thermal Derivatization of Porous Silicon with Alcohols," J. Am. Chem. Soc., Mar. 5, 1997, 119, pp. 2297-2298.
Hua, Fengjun et al., "Organically Capped Silicon Nanoparticles with Blue Photoluminescence Prepared by Hydrosilylation Followed by Oxidation," Langmuir, Mar. 2006, pp. 4363-4370.
Derwent English Abstract for publication No. SU 193241 A, Application No. 1973SU1943286 filed on Jul. 2, 1973, published on Mar. 1, 1976, entitled"Catalyst for Ammonia Synthesis Contains Oxides of Aluminium, Potassium, Calcium, Iron and Nickel Oxide for Increased Activity," 3 pgs.
U.S. Appl. No. 12/961,030, filed Dec. 6, 2010, for Lehman.
U.S. Appl. No. 12/961,108, filed Dec. 6, 2010, for Lehman.

* cited by examiner

IN SITU OXIDE REMOVAL, DISPERSAL AND DRYING

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates generally to the field of powder material production. More specifically, the present invention relates to a process for removing oxide from produced metallic powders.

BACKGROUND OF THE INVENTION

This disclosure refers to both particles and powders. These two terms are equivalent, except for the caveat that a singular "powder" refers to a collection of particles. The present invention may apply to a wide variety of powders and particles. Powders that fall within the scope of the present invention may include, but are not limited to, any of the following: (a) nano-structured powders (nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million.

Powders are used in a wide variety of applications. Currently, metallic powders (particles having a core that is either a pure metal or a metal alloy) are offered having an oxide shell. FIG. 1 is a cross-sectional side view of a metallic particle 100 having a metal, or metal alloy, core 102 covered by an oxide layer 104. As seen in FIG. 1, the oxide layer 104 can be quite thick, accounting for approximately 60% (sometimes more) of the entire size of the particle 100. This substantial oxide shell may be useful in certain applications. However, in other situations, it may be undesirable to have such a significant oxide presence.

SDC Materials, LLC has developed an in situ process that employs the use of flowing plasma and a vacuum system in order to produce particles having a reduced oxide layer. FIG. 2 is a cross-sectional side view of a metallic particle 200 resulting from such a process. The particle 200 has a metal, or metal alloy, core 202 covered by an oxide shell 204. As can be seen by comparing FIG. 2 to FIG. 1, the thickness of oxide layer 204 for particle 200 is significantly reduced from the thickness of oxide layer 104 for particle 100. Using this process, the thickness of the oxide layer can be reduced to less than 10% of the entire particle thickness. While providing a considerable improvement over the particle of FIG. 1, this process still does not achieve complete oxide removal from the particle. As a result, this nano-particle 200 may still prove to be undesirable for certain applications.

Currently, there is no way to create metallic particles having no oxygen. Even the best vacuum system has oxygen in it. As a result, the end product might not be sufficient for those who want oxide-free metallic powder.

What is needed in the art is a method for producing metallic powders that do not contain any oxygen.

SUMMARY OF THE INVENTION

The present invention provides a process for producing metallic powders that do not contain any oxygen. FIG. 3 is a cross-sectional side view of a powder particle 300 that is produced using the process of the present invention. Particle 300 comprises a metal, or metal alloy, core 302, and is characterized by the absence of an oxide shell, in contrast to the particles of FIGS. 1 and 2.

In one embodiment, the process of the present invention comprises providing a powder defined by a plurality of particles. Each particle in the plurality of particles has a metallic core and an oxide layer surrounding the metallic core. The plurality of particles are then etched. This etching serves to remove the oxide layer from each particle in the plurality of particles, leaving only the metallic core. In this fashion, bare metallic powder has been provided free of any oxide.

Additional steps may then be taken to prepare the powder for its eventual application. Each particle in the etched plurality of particles can be coated with an organic layer. The etched powder may also be dispersed using a dispersing solution.

The steps of etching, coating and dispersing are performed in situ with the plurality of particles disposed in liquid, absent any exposure of the metallic cores to air both during and in between these steps.

The final product may be provided as a dispersion of particles stored in a liquid. Alternatively, the final product may be provided as a dried and settled powder absent any liquid.

In another embodiment, a method for removing silicon-dioxide from silicon powder is provided. The method comprises providing a silicon powder defined by a plurality of particles. Each particle in the plurality of particles has a silicon core and a silicon dioxide layer surrounding the silicon core. The plurality of particles is dispersed in a dispersing solution, preferably methanol. An etching solution, preferably hydrofluoric acid, is added to the dispersing solution. The etching solution removes the silicon dioxide layer from each particle.

An organic solvent, such as cyclohexane or toluene, is then added to the mixture of the dispersing solution and the etching solution. The addition of the organic solvent produces an organic phase and an aqueous phase. The organic phase comprises substantially all of the silicon cores and substantially all of the organic solvent, and the aqueous phase comprises substantially all of the dispersing solution, substantially all of the etching solution, and substantially all of the by-products resulting from the silicon dioxide removal. Each silicon core in the plurality of particles is then coated with an organic material from the organic solvent. The aqueous phase is drained out and the organic phase is washed, removing substantially all of the remaining aqueous phase material from the organic phase. The silicon powder can then be provided as a plurality of silicon cores that are absent a silicon dioxide layer surrounding each silicon core, with each silicon core having an organic coating. The steps of dispersing, adding an etching solution, adding an organic solvent, coating, draining, and washing are performed in situ with the plurality of particles disposed in liquid, absent any exposure of the silicon cores to air.

In yet another embodiment, a method for removing copper-oxide from copper powder is provided. The method comprises providing a copper powder defined by a plurality of particles, with each particle in the plurality of particles having a copper core and a copper-oxide layer surrounding the copper core. The plurality of particles are disposed in an etching solution in a container. The etching solution, preferably comprising acetic acid and water, removes the copper-oxide layer from each particle. The etching solution and the by-products resulting from the copper-oxide removal are then decanted, and the plurality of particles are washed, removing substantially all of the remaining etching solution and substantially all of the by-products from the container holding the plurality of particles.

The washed plurality of particles is disposed in an organic solvent, preferably comprising tetraethylene glycol and water. Each copper core in the plurality of particles is then coated with an organic material from the organic solvent, and the plurality of particles is dispersed in the organic solvent. The copper powder may then be provided as a plurality of dispersed copper cores that are absent a copper-oxide layer surrounding each copper core, with each copper core having an organic coating. The steps of dispersing in the etching solution, decanting, washing, disposing in the organic solvent, coating, and dispersing are performed in situ with the plurality of particles disposed in liquid, absent any exposure of the copper cores to air.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
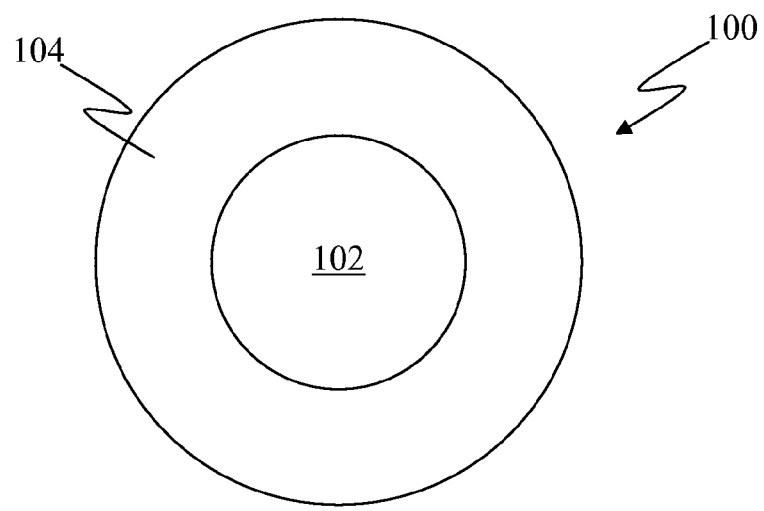
FIG. 1 is a cross-sectional side view of a powder particle having an oxide shell.
Figure 2:
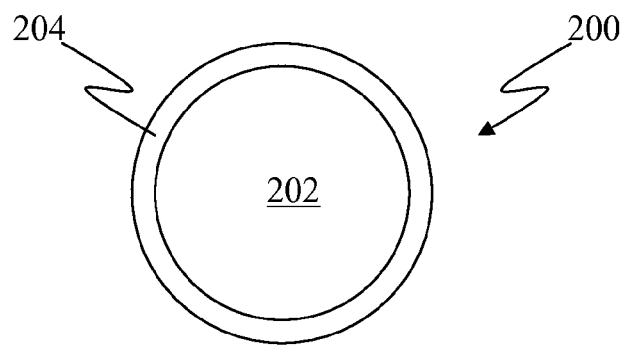
FIG. 2 is a cross-sectional side view of a powder particle having a reduced oxide shell.
Figure 3:
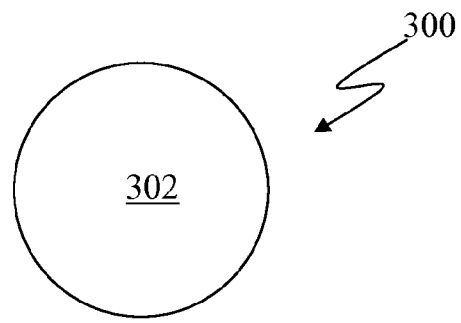
FIG. 3 is a cross-sectional side view of a powder particle having no oxide shell in accordance with the principles of the present invention.
Figure 4:
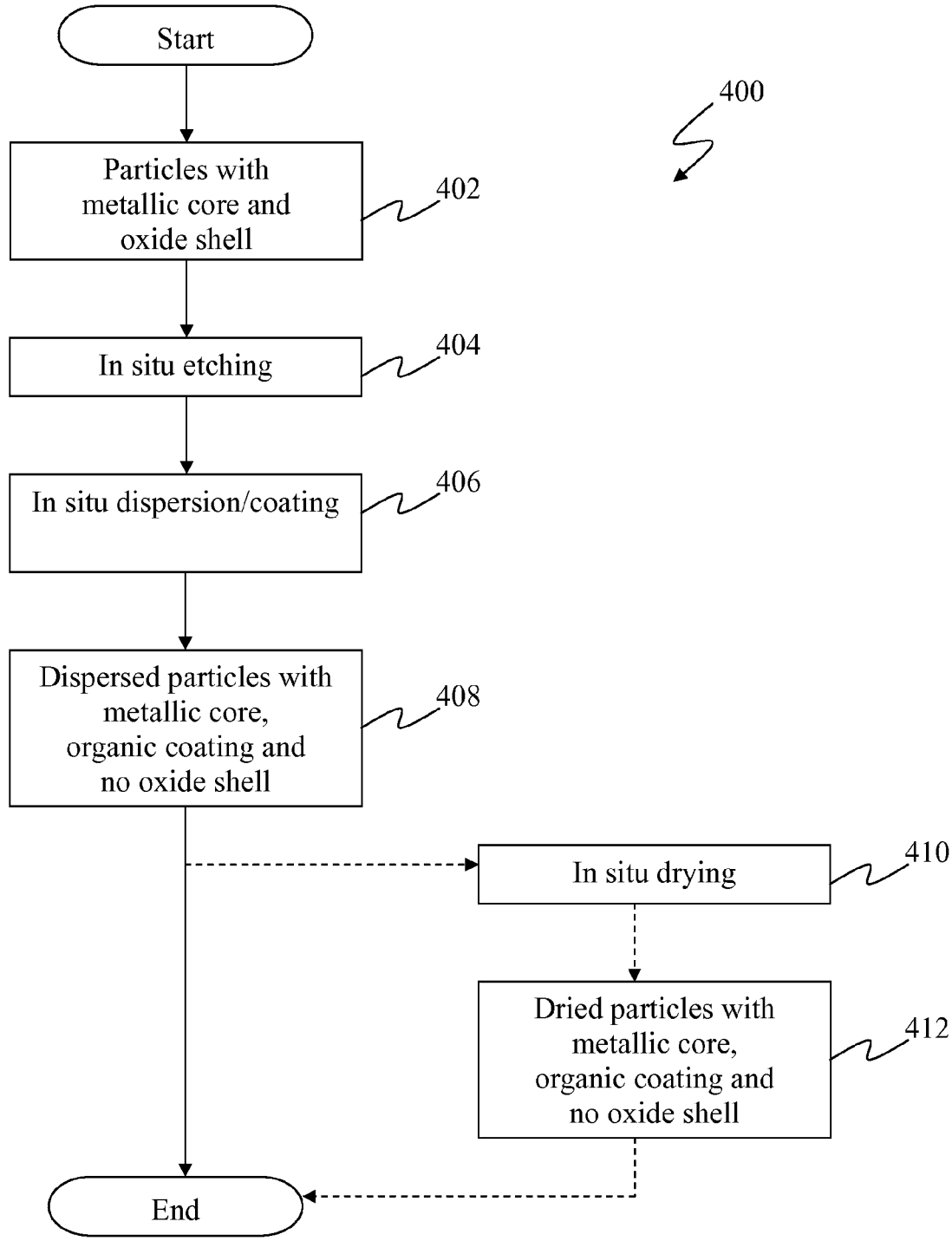
FIG. 4 is a flowchart illustrating one embodiment of a general work flow in accordance with the present invention.
Figure 5A:
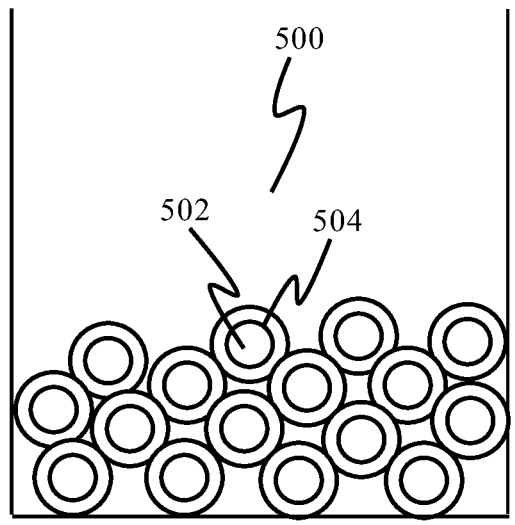
FIGS. 5A-F illustrate exemplary embodiments of the different powder states during the general work flow in accordance with the present invention.

FIG. 4 is a flowchart illustrating one embodiment of a general work flow 400 in accordance with the principles of the present invention. At step 402, a powder is provided in the form of a plurality of particles having a metallic core and an oxide layer surrounding the metallic core. As previously mentioned, this metallic core may be a pure metal or a metal alloy. The powder is preferably provided in a dry state. FIG. 5A illustrates one embodiment of the powder 500 being provided in a container as a plurality of particles having a metallic core 502 and an oxide layer 504. Typically, the dry powder 500 is settled at the bottom of the container as shown. It is to be understood that FIGS. 5A-F are only provided to illustrate the general principles of the present invention and should not be used to limit the scope of the claims with respect to details such as size, shape and quantity.

Figure 5B:
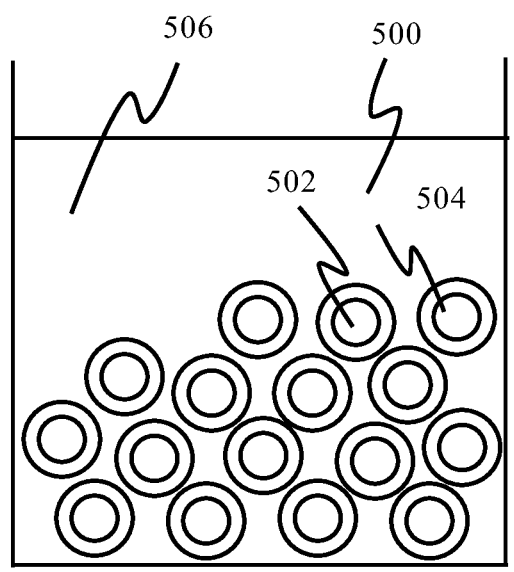
Figure 5C:
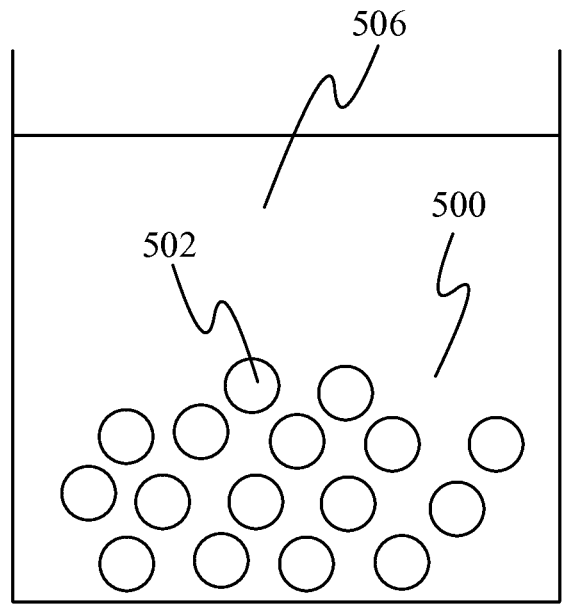

At step 404, the particles are then etched in situ. This etching serves to remove the oxide layer from each particle in the plurality of particles, leaving only the metallic core. Preferably, each one of the plurality of particles retains substantially all of its metallic core. In this fashion, a metallic powder has been produced free of any oxide. In a preferred embodiment, the etching is achieved by disposing the powder in an etching solution. FIG. 5B illustrates one embodiment of an etching solution 506 being introduced into the container and interacting with the oxide layer 504 of each particle. The powder 500 can be stirred in the etching solution 506 in order to assist with this interaction. The application of the etching solution 506 may cause the particles to become slightly suspended for a period of time before settling. FIG. 5C illustrates one embodiment of the resulting removal of the oxide layer 504 from the metallic core 502 of each particle.

Figure 5D:
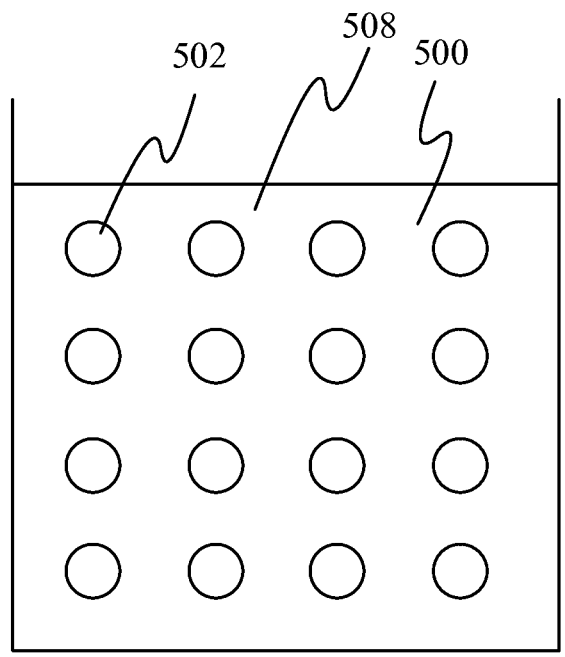
Figure 5E:
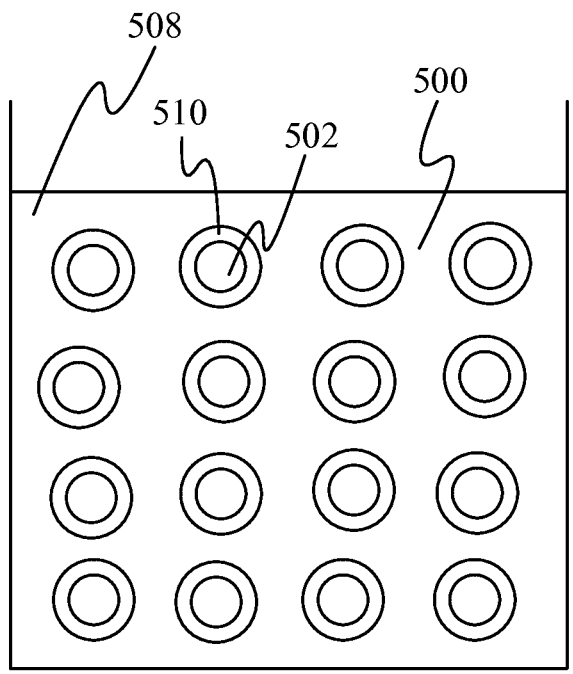

The powder may then go through an in situ coating/dispersion process at step 406 in order to prepare it for its eventual application. The coating process involves coating each particle that has been etched with an organic layer. This coating may be achieved by disposing the etched powder in an organic solvent. The dispersion process involves dispersing the plurality of etched particles. This dispersion may be achieved by disposing the etched powder in a dispersing solution. While the coating and dispersing processes are grouped together at step 406, they do not necessarily need to occur at the same time. The coating may be performed prior to the dispersing, and likewise, the dispersing may be performed prior to the coating. Furthermore, the existence of one does not necessarily depend on the existence of the other. In fact, the achievement of an oxide-free metallic powder may be achieved in the absence of either or both of these operations. However, in a preferred embodiment, the powder is both coated and dispersed in order to attain optimum stability and preparation. FIG. 5D illustrates one embodiment of a coating and dispersing solution 508 being introduced into the container and interacting with each particle. As a result, the powder is dispersed, and each metallic core 502 becomes coated with an organic material 510, as seen in FIG. 5E.

At step 408, the powder may be provided as a dispersion of particles, with each particle having a metallic core and no oxide shell. Preferably, the powder is maintained as a dispersion in a storage liquid, with each particle having an organic coating surrounding its metallic core. This storage liquid may simply be the coating/dispersing solution or may be some other type of liquid appropriate for storing the powder.

Figure 5F:
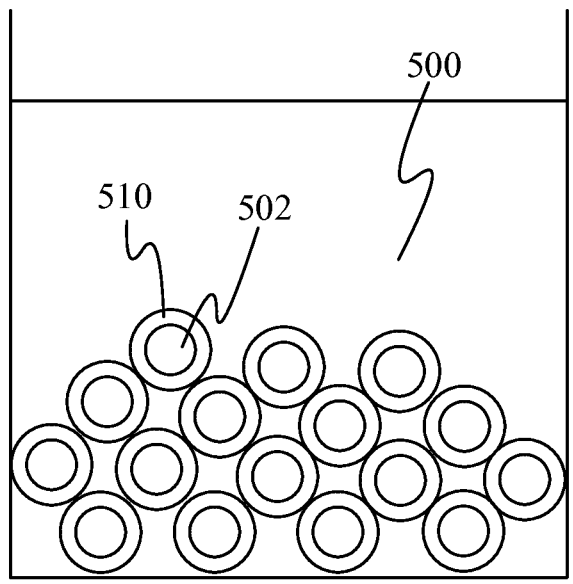

For certain applications, such as sintering, it may not be desirable to provide the powder in a liquid. Instead, circumstances may dictate that the powder be provided in a dry state. In these situations, the oxide-free particles can be dried in situ at step 410. The powder may then be provided at step 412 as dried particles, each having a metallic core, preferably surrounded by an organic coating, and no oxide shell, as seen in FIG. 5F. In the example of sintering, the dried powder may then be placed in a Spark-Plasma Sintering (SPS) machine having a reducing atmosphere. The reducing atmosphere matches the organic layer and serves to reduce the organic layer by burning it off, leaving a pure metallic core and a gas by-product. The metallic cores are then fused together, resulting in an ultra-pure block of metal having nano-properties.

The present invention may be used for a wide variety of metallic powders. Such powders may include, but are not limited to, silicon and copper.

Figure 6:
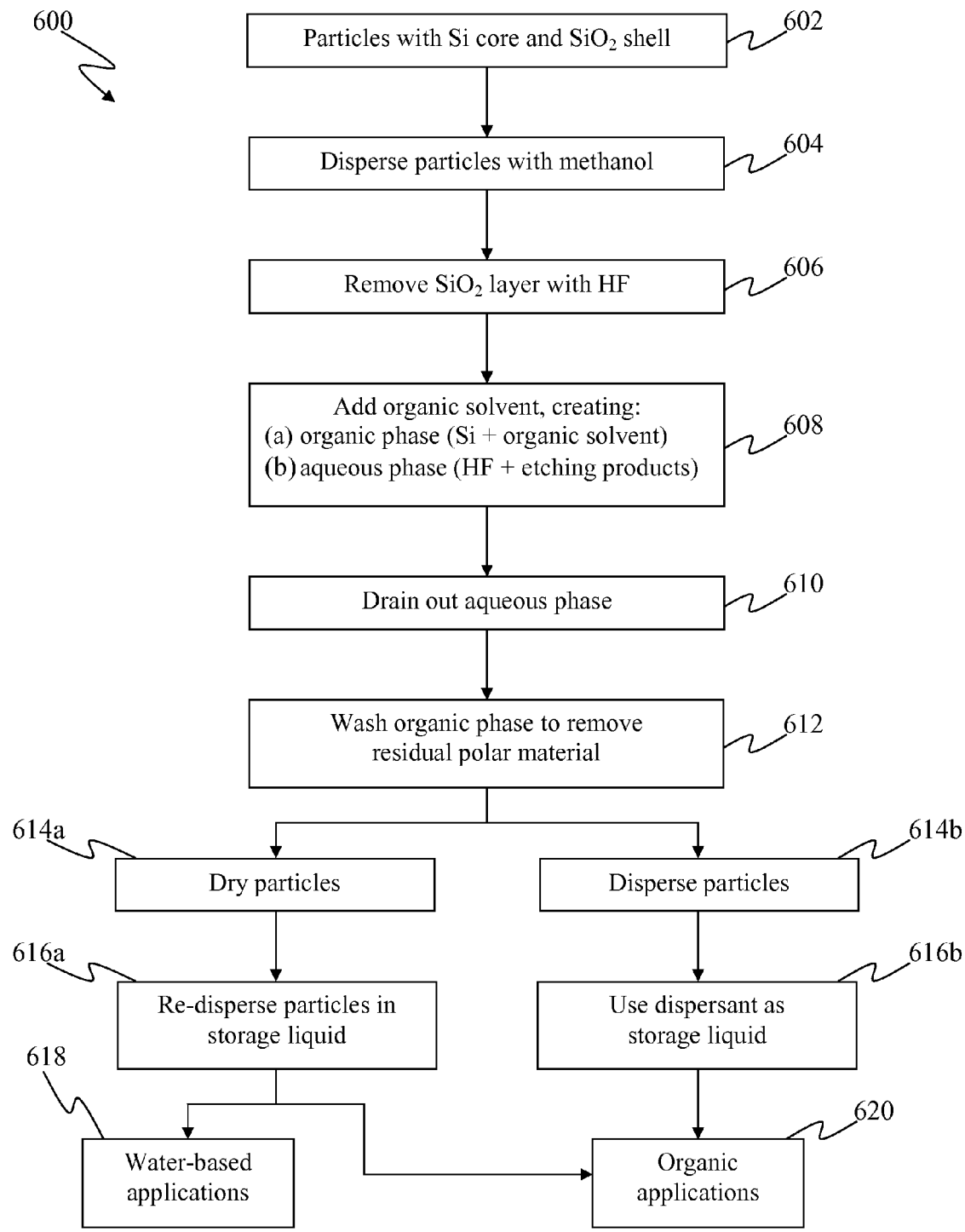
FIG. 6 is a flowchart illustrating one embodiment of a work flow for silicon powder in accordance with the present invention.
Figure 7A:
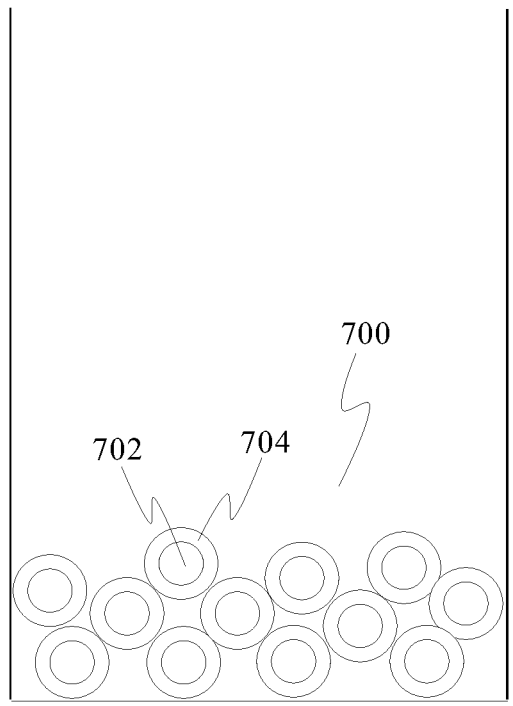
FIGS. 7A-F illustrate exemplary embodiments of the different powder states during the silicon powder work flow in accordance with the present invention.

FIG. 6 is a flowchart illustrating one embodiment of a work flow 600 for removing the oxide layer from silicon powder in accordance with the present invention. At step 602, the powder is provided as-produced, with each particle having a silicon core and a silicon-dioxide shell layer. This silicon core may be pure silicon or a silicon alloy. The powder is preferably provided in a dry state. FIG. 7A illustrates one embodiment of the powder 700 being provided in a container as a plurality of particles having a silicon core 702 and a silicon-dioxide shell 704. Typically, the dry powder 700 is settled at the bottom of the container as shown. It is to be understood that FIGS. 7A-F are only provided to illustrate the general principles of the present invention and should not be used to limit the scope of the claims with respect to details such as size, shape and quantity.

Figure 7B:
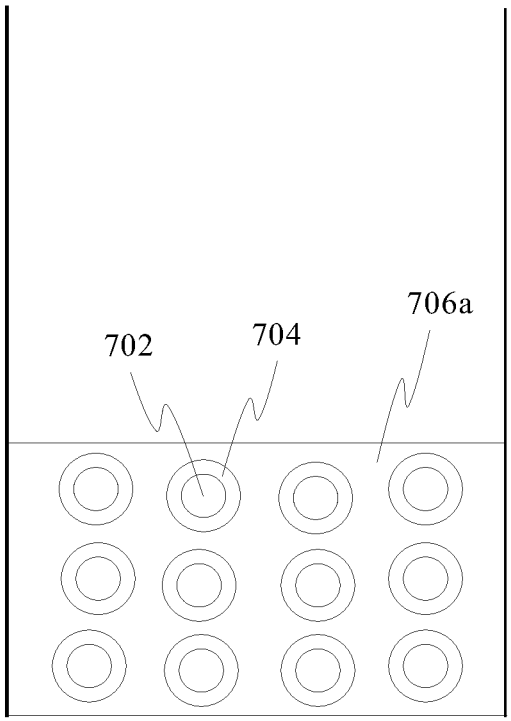

At step 604, methanol 706a is added to the container and then stirred in order get a dispersion of particles, as seen in FIG. 7B.

Figure 7C:
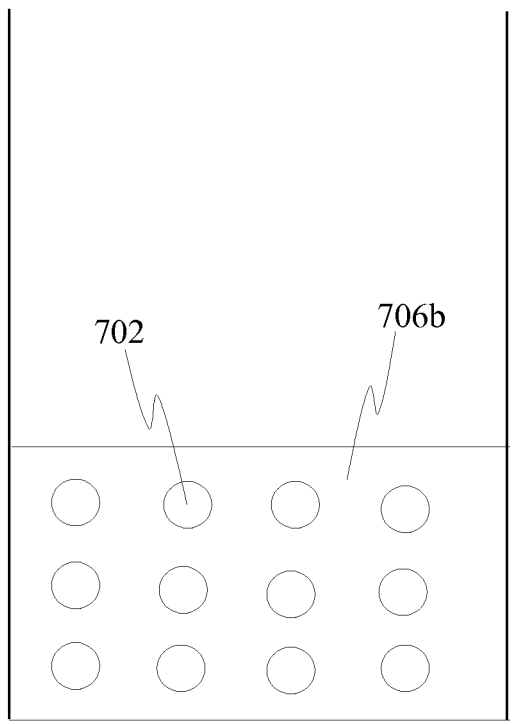

At step 606, a hydrogen fluoride (HF) solution (i.e., hydrofluoric acid) is added to the container in order to remove the oxide. As seen in FIG. 7C, the result is a plurality of silicon cores 702 dispersed in a mixture 706b of water, HF and methanol. In a preferred embodiment, the solution contains approximately 10% HF and is applied to the particles for between approximately 1 to 5 minutes at about room temperature. However, it is contemplated that the HF concentration, time applied and environment temperature may vary according to the particular circumstances in which the present invention is being employed.

Figure 7D:
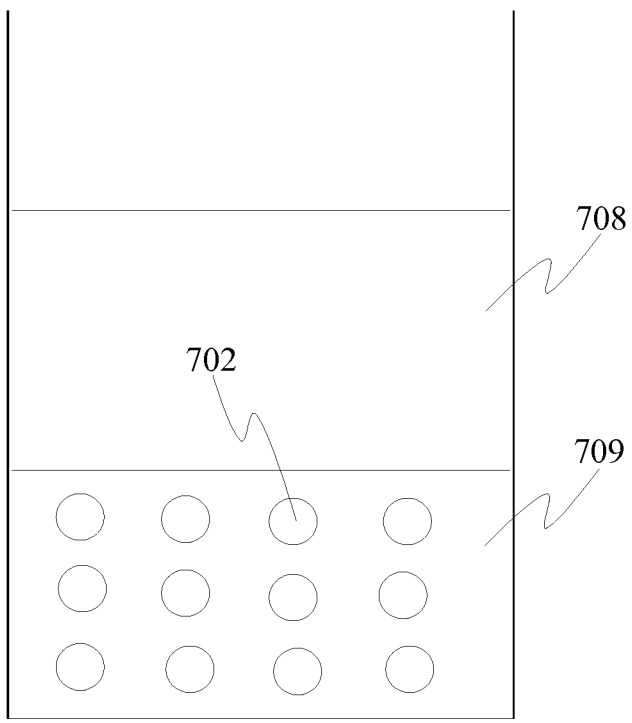
Figure 7E:
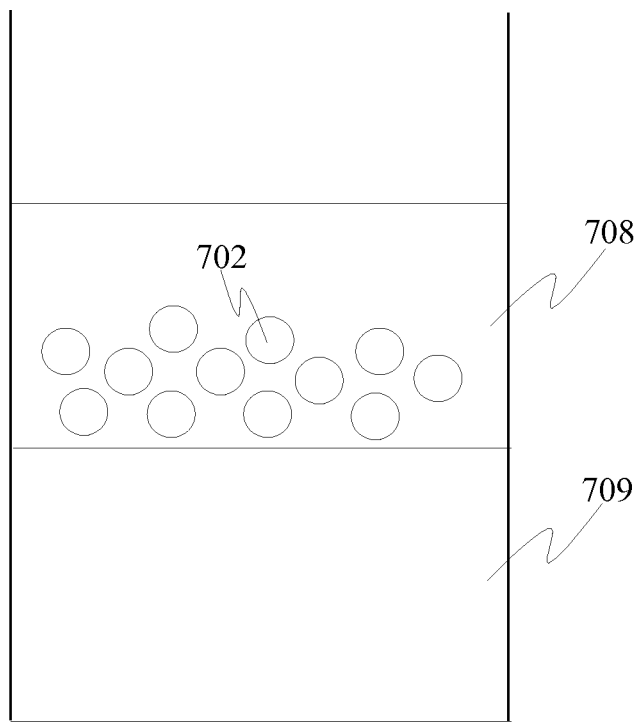

At step 608, an organic solvent is added to the container. Such organic solvents may include, but are not limited to, cyclohexane and toluene. As seen in FIG. 7D, the addition of the organic solvent produces an organic phase 708, having the organic solvent, on top of an aqueous phase 709, having the silicon cores 702 dispersed in the HF/water/methanol mixture, with a sharp interface in between the two phases. Due to their hydrophobic properties, the silicon cores 702 then diffuse up into the organic phase 708, as seen in FIG. 7E, leaving the HF/water/methanol mixture and any etching products in the aqueous phase 709.

Figure 7F:
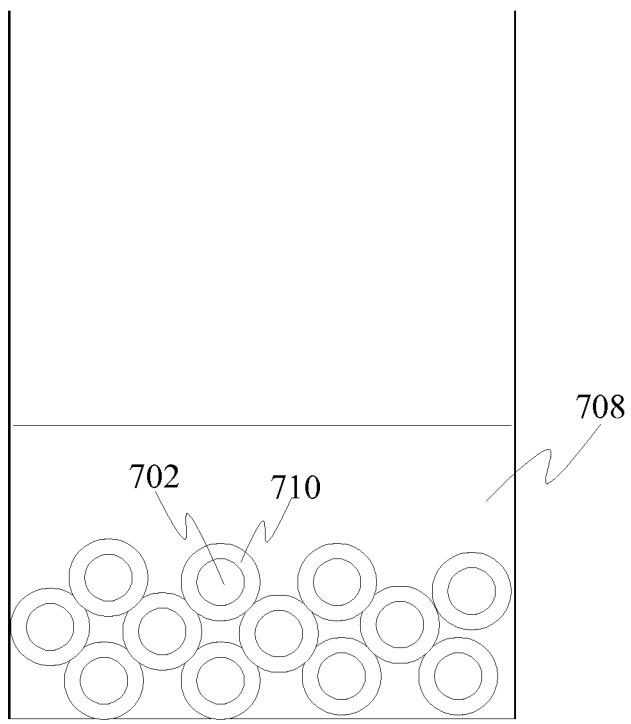

At step 610, the aqueous phase 709 is drained out of the container, taking most, if not all, of the HF/water/methanol mixture and etching products with it, and leaving behind the organic phase 708 with the silicon cores 702 each coated with an organic layer 710, as seen in FIG. 7F.

At step 612, the organic phase 708 may be washed with water in order to remove residual HF and any other undesirable polar material. This washing step may be repeated as many times as necessary in order to achieve optimum residue removal. However, in a preferred embodiment, the organic phase is washed twice with water.

At this point, the process may take two separate paths, either drying the particles at step 614a or dispersing the particles at step 614b.

At step 614a, the organic phase is dried down to only the powder in the container. The particles are then immediately stored in a storage liquid at step 616a, where they may be re-dispersed. The storage liquid is either in the polar-organic range, such as tetraethylene glycol or other glycol solvents, or the hydrophobic range. This path allows the powder to be used in water-based applications at step 618 and/or organic coating applications at step 620.

At step 614b, a dispersant is added to the washed organic phase, thereby dispersing the particles. The dispersant may then be used as a storage liquid at step 616b. This path allows the powder to be used in organic coating applications at step 620.

Figure 8:
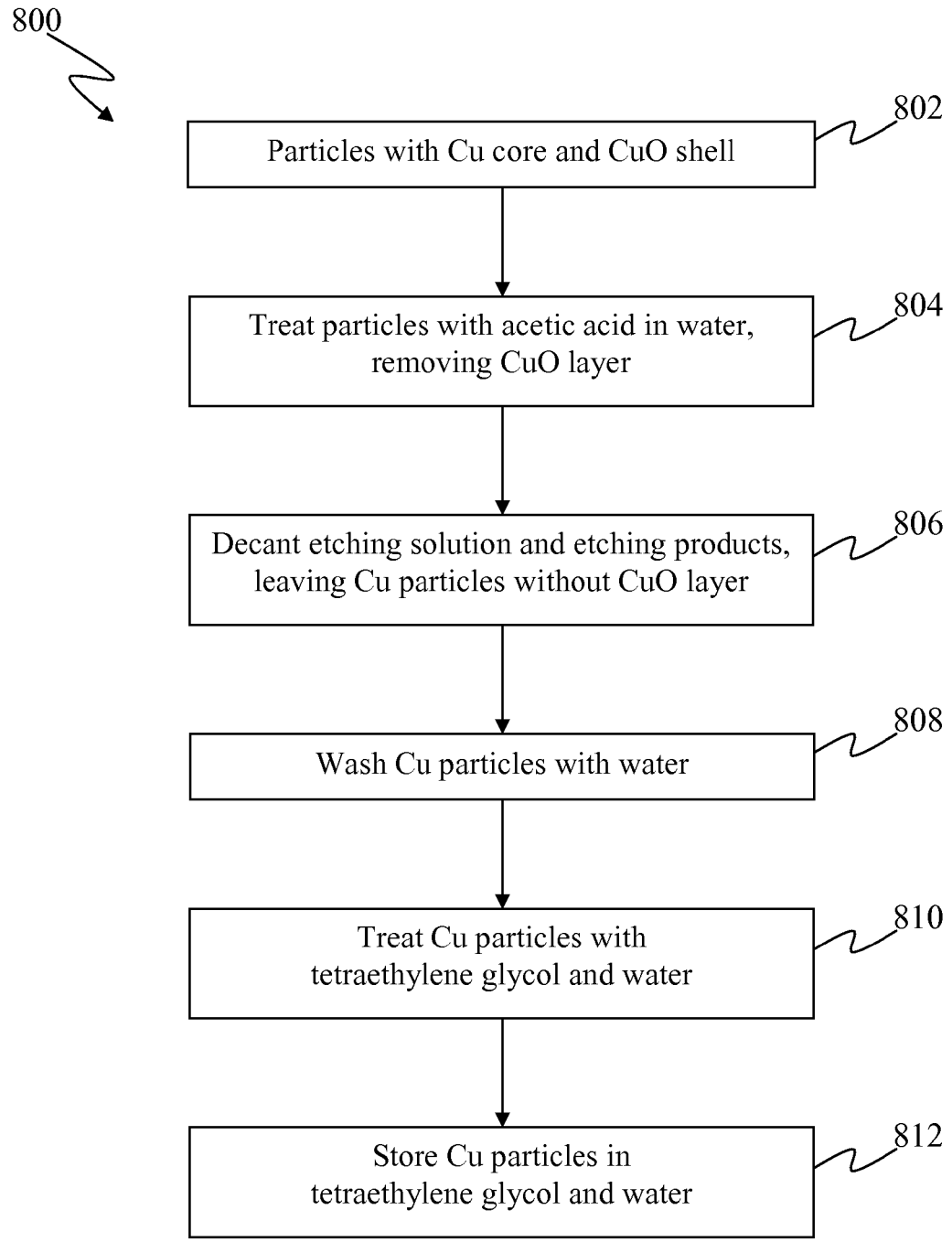
FIG. 8 is a flowchart illustrating one embodiment of a work flow for copper powder in accordance with the present invention.
Figure 9A:
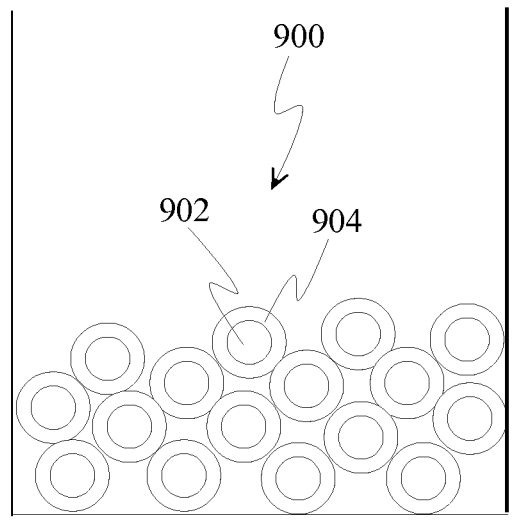
FIGS. 9A-H illustrate exemplary embodiments of the different powder states during the copper powder work flow in accordance with the present invention.

FIG. 8 is a flowchart illustrating one embodiment of a work flow 800 for removing the oxide layer from copper powder in accordance with the present invention. At step 802, the powder is provided as produced, with each particle having a copper core and a copper-oxide shell layer. This copper core may be pure copper or a copper alloy. The powder is black and is preferably provided in a dry state. FIG. 9A illustrates one embodiment of the powder 900 being provided in a container as a plurality of particles having a copper core 902 and a copper-oxide shell 904. Typically, the dry powder 900 is settled at the bottom of the container as shown. It is to be understood that FIGS. 9A-H are only provided to illustrate the general principles of the present invention and should not be used to limit the scope of the claims with respect to details such as size, shape and quantity.

Figure 9B:
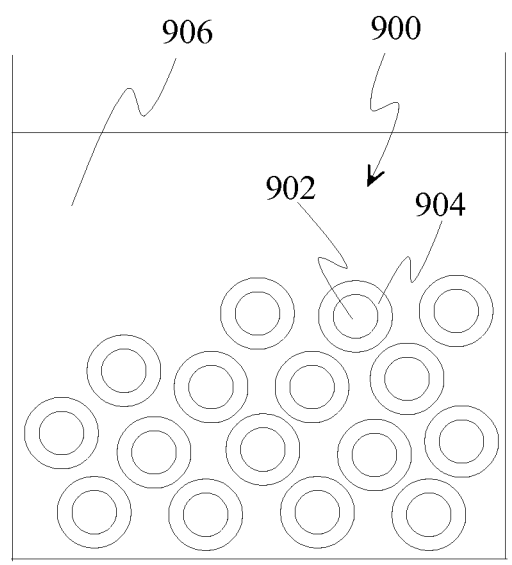
Figure 9C:
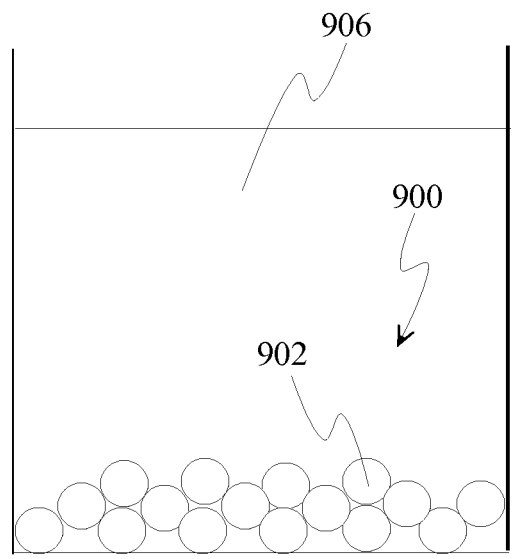

At step 804, the powder is treated with acetic acid in water. The mixture of acetic acid and water forms an etching solution that is used to remove the oxide layer 904 from the copper core 902. In a preferred embodiment, the solution contains approximately 0.1% to 1% acetic acid. However, it is contemplated that a variety of different concentrations may be employed. FIG. 9B illustrates one embodiment of the acetic acid solution 906 being introduced into the container and interacting with the oxide layer 904 of each particle. The application of the solution 906 may cause the particles to become slightly suspended for a period of time before settling at the bottom of the container. FIG. 9C illustrates one embodiment of the resulting removal of the oxide layer 904 from the copper core 902 of each particle. The etching products (removed copper-oxide, etc.) rise to the upper portion of the mixture, while the resulting copper-colored powder resides on the bottom, typically in a non-dispersed arrangement.

Figure 9D:
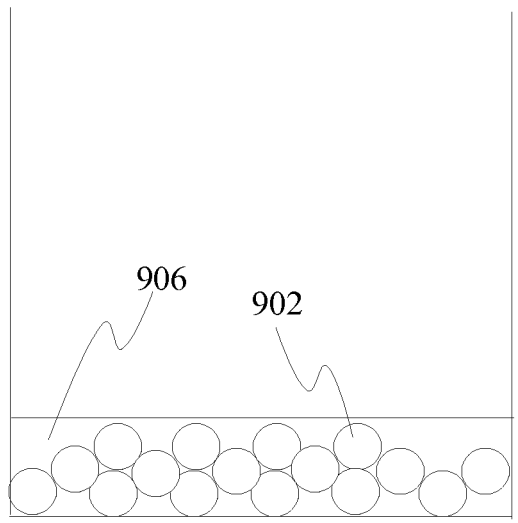

At step 806, one or more decantations is performed in order to remove a majority, if not all, of the etching solution and products. As seen in FIG. 9D, any remaining etching solution 906 and/or etching products is minimal.

Figure 9E:
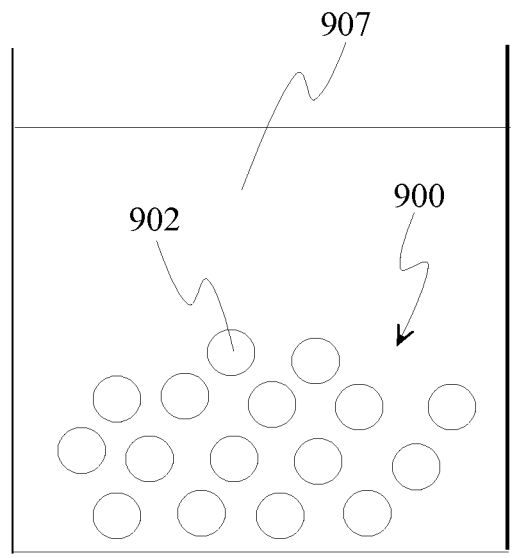
Figure 9F:
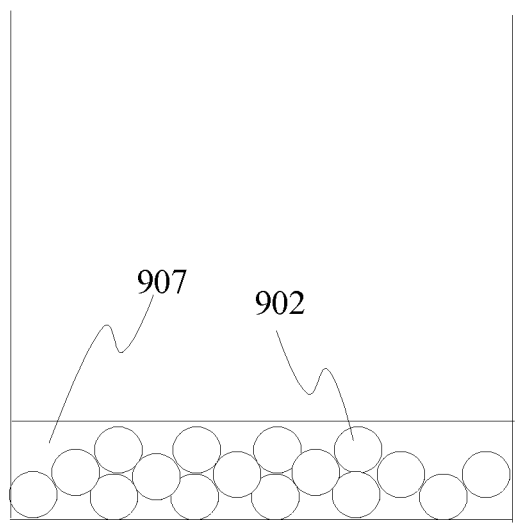

At step 808, the powder may then be washed with water 907, as seen in FIG. 9E, in order to remove any remaining etching solution or etching products. This washing step may be repeated as many times as necessary in order to achieve optimum residue removal. However, in a preferred embodiment, the powder is washed twice. Preferably, a minimal amount of the washing water 907 is left in the container, as seen in FIG. 9F.

Figure 9G:
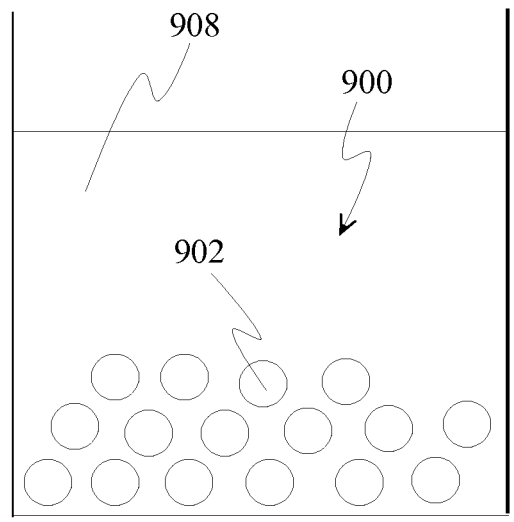
Figure 9H:
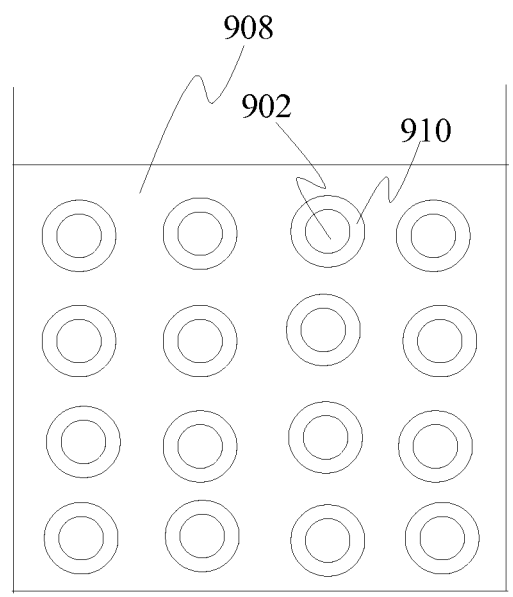

At step 810, the powder is treated with a tetraethylene glycol (or some other glycol solvent) and water solution 908, as seen in FIG. 9G. The interaction of this solution 908 with the copper cores 902 forms a dispersion of copper cores 902 each having an organic coating 910, as seen in FIG. 9H.

At step 812, the resulting copper particles may be stored in the glycol solvent and water solution. This powder can maintain the same copper coloring for weeks without any discoloration.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A method of removing oxide from metallic powder, the method comprising:
    providing a powder defined by a plurality of particles, wherein the particles comprise a metallic core and an oxide layer surrounding the metallic core;
    etching the plurality of particles in an etching solution, wherein the oxide layer is removed from the particles, leaving the metallic core;
    decanting the etching solution;
    after decanting the etching solution, disposing the plurality of particles in an organic solvent;
    directly coating the surface of the particles in the etched plurality of particles with an organic layer;
    dispersing the etched plurality of particles; and
    providing the powder as dispersed particles that are absent an oxide layer surrounding the metallic core, wherein the metallic cores comprise an organic layer,
    wherein the etching, coating and dispersing are performed in situ with the plurality of particles disposed in liquid, absent any exposure of the metallic cores to air.

2. The method of claim 1, wherein the step of providing the powder comprises providing the powder in a dry state.

3. The method of claim 1, wherein the step of etching further comprises disposing the plurality of particles in an etching solution.

4. The method of claim 1, wherein the step of etching further comprises the particles retaining substantially all of the metallic core.

5. The method of claim 1, wherein the step of dispersing further comprises disposing the plurality of particles in a dispersing solution.

6. The method of claim 1, further comprising the steps of:
    drying the etched and coated plurality of particles; and
    providing the powder as a plurality of dry particles that are absent an oxide layer surrounding the metallic core.

7. The method of claim 1, wherein the metallic core is selected from the group consisting of a pure metal and a metal alloy.

8. The method of claim 1, wherein the metallic core is copper and the oxide layer is copper oxide.

9. The method of claim 1, wherein the powder is a nano-powder having an average grain size less than 250 nanometers.

10. The method of claim 1, wherein the powder is a sub-micron powder having an average grain size less than 1 micron.

11. The method of claim 1, wherein the powder is ultra-fine powder having an average grain size less than 100 microns.

12. The method of claim 1, wherein the powder is fine powder having an average grain size less than 500 microns.

13. The method of claim 1, further comprising washing the etched plurality of particles before disposing the plurality of particles in an organic solvent.

* * * * *